(12) United States Patent
Madison

(10) Patent No.: US 12,328,105 B2
(45) Date of Patent: Jun. 10, 2025

(54) HIGH BANDWIDTH TRANSIMPEDANCE AMPLIFIER

(71) Applicant: BAE SYSTEMS Information and Electronic Systems Integration Inc., Nashua, NH (US)

(72) Inventor: Gary M. Madison, Waltham, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 496 days.

(21) Appl. No.: 17/847,733

(22) Filed: Jun. 23, 2022

(65) Prior Publication Data

US 2023/0421116 A1    Dec. 28, 2023

(51) Int. Cl.
  *H03F 3/08* (2006.01)
  *H03F 1/08* (2006.01)
  *H03F 3/45* (2006.01)

(52) U.S. Cl.
  CPC ............. *H03F 3/082* (2013.01); *H03F 1/086* (2013.01); *H03F 3/085* (2013.01); *H03F 3/45475* (2013.01); *H03F 2200/451* (2013.01)

(58) Field of Classification Search
  CPC ...... H03F 3/082; H03F 3/085; H03F 3/45475; H03F 3/08; H03F 1/086; H03F 1/483; H03F 2200/451; H03G 3/3084
  USPC ....... 330/277, 59, 308, 250, 241 A, 214 AG, 330/264, 265, 269, 311
  See application file for complete search history.

(56) References Cited

U.S. PATENT DOCUMENTS

| | | |
|---|---|---|
| 7,265,631 B2 | 9/2007 | Kwa et al. |
| 7,265,632 B2 | 9/2007 | Kwa et al. |
| 7,518,447 B1 | 4/2009 | Tan et al. |
| 8,629,726 B1 | 1/2014 | Madison |
| 9,379,674 B2 | 6/2016 | Kim et al. |

(Continued)

FOREIGN PATENT DOCUMENTS

WO    2018228772 A1    12/2018

OTHER PUBLICATIONS

Allen, M; Sharman, P, "Photodiode arrays support diverse applications", Feb. 1, 2003. Laser Focus World. https://www.laserfocusworld.com/detectors-imaging/article/16554563/photodiode-arrays-support-diverse-applications (Year: 2003).*

*Primary Examiner* — Andrea Lindgren Baltzell
*Assistant Examiner* — Nareh Shamiryan
(74) *Attorney, Agent, or Firm* — Gary McFaline

(57) ABSTRACT

Techniques are provided for a transimpedance amplifier (TIA). A TIA implementing the techniques according to an embodiment includes a pre-amplifier stage configured to amplify an input signal. The pre-amplifier stage includes a first P-channel metal oxide semiconductor field effect transistor (MOSFET) (P1), a second P-channel MOSFET (P2), a first N-channel MOSFET (N1), and a second N-channel MOSFET (N2), coupled in series. The gates of P1 and N2 are driven by the input signal. The output of the pre-amplifier stage is provided at a coupling between the drain of P2 and the drain of N1. The pre-amplifier stage also includes an active resistor network configured to provide a variable resistance based on a provided current bias generated from a gain control signal. The active resistor network is coupled between the gate of P1 and the drain of P2. The variable resistance is used to control the gain of the pre-amplifier stage.

16 Claims, 6 Drawing Sheets

(56) References Cited

U.S. PATENT DOCUMENTS

| | | | |
|---|---|---|---|
| 9,391,563 B2* | 7/2016 | Story | H03M 1/002 |
| 9,407,218 B2 | 8/2016 | Huang et al. | |
| 9,768,747 B2 | 9/2017 | Barabas et al. | |
| 10,044,328 B2 | 8/2018 | Khaw | |
| 10,141,904 B2 | 11/2018 | Barabas et al. | |
| 10,312,866 B2 | 6/2019 | Barabas et al. | |
| 10,348,255 B1 | 7/2019 | Lee et al. | |
| 10,530,307 B2 | 1/2020 | Li et al. | |
| 10,680,566 B2 | 6/2020 | Li et al. | |
| 10,855,229 B2 | 12/2020 | Barabas et al. | |
| 11,218,124 B2 | 1/2022 | Peng et al. | |
| 2006/0261892 A1 | 11/2006 | Sutardja | |
| 2016/0142026 A1* | 5/2016 | Kim | H03F 1/223 |
| | | | 330/291 |
| 2021/0091740 A1* | 3/2021 | Lin | H03G 3/3073 |
| 2022/0321811 A1* | 10/2022 | Myers | H03F 3/45632 |
| 2023/0246603 A1* | 8/2023 | Hagman | H03F 3/45183 |
| | | | 330/308 |

* cited by examiner

HIGH BANDWIDTH TRANSIMPEDANCE AMPLIFIER

STATEMENT OF GOVERNMENT INTEREST

This invention was made with United States Government assistance under Contract No. HR001117C0066, awarded by the United States Government. The United States Government has certain rights in this invention.

FIELD OF DISCLOSURE

The present disclosure relates to amplifiers, and more particularly to high bandwidth transimpedance amplifiers.

BACKGROUND

Amplifiers are used in numerous applications to amplify relatively low power signals to a point at which subsequent signal processing can be performed. Existing amplifiers typically employ differential amplifier input stages that provide limited transconductance while consuming relatively large supply current. Other problems with existing amplifiers include increased capacitance imparted by the current source without any offsetting performance benefit and poor power supply isolation. These issues can cause the amplifiers to be unsuitable for many applications, particularly where size and power consumption are constrained.

Figure 1:
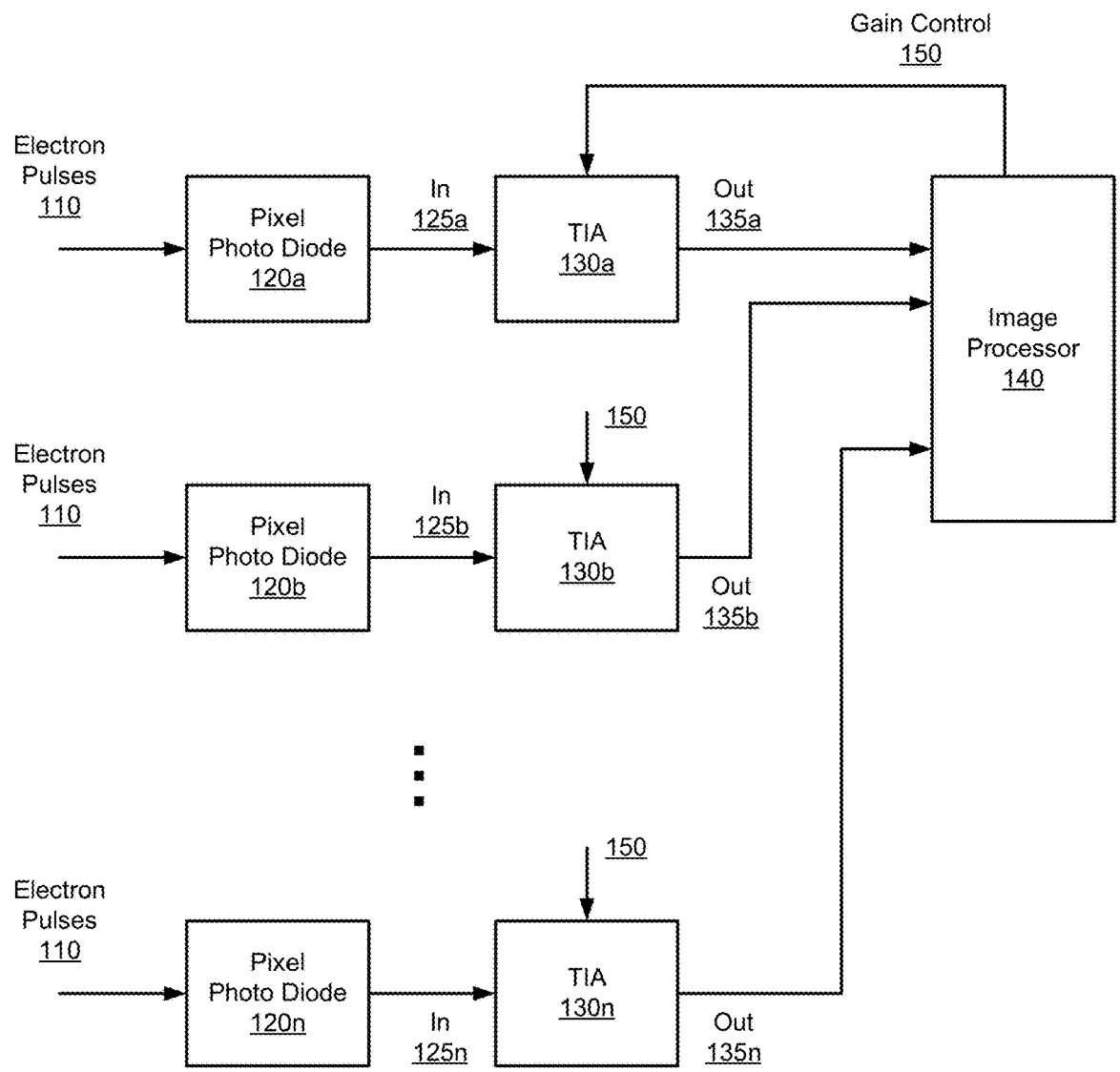
FIG. 1 illustrates an imaging system employing transimpedance amplifiers (TIAs), in accordance with certain embodiments of the present disclosure.

Although the following Detailed Description will proceed with reference being made to illustrative embodiments, many alternatives, modifications, and variations thereof will be apparent in light of this disclosure.

DETAILED DESCRIPTION

Techniques are provided herein for a high bandwidth transimpedance amplifier (TIA), (e.g., a current to voltage converter that provides signal gain). As noted previously, amplifiers are used in numerous applications to amplify low power signals prior to the performance of other signal processing operations. Existing amplifiers, however, can suffer from a number of limitations such as limited transconductance while consuming a relatively large supply current, additional capacitance associated with the current source without any offsetting performance benefit, and poor power supply isolation. These issues can cause the amplifiers to be unsuitable for many applications, particularly where amplifier size and power consumption are constrained.

To this end, and in accordance with an embodiment of the present disclosure, a TIA is disclosed which provides improved performance for high bandwidth, low power signals. In an example, the disclosed TIA provides improved amplifier gain over a higher bandwidth while consuming less power in a smaller form factor, allowing it to fit, for instance, within a pixel of an imaging camera or a radio frequency (RF) receiver implemented in an Application-Specific Integrated Circuit (ASIC). The disclosed TIA can be used, for instance, with imaging systems and on chip RF receivers in a wide variety of applications including, for example, radar systems and communication systems that can be deployed on aircraft (manned and unmanned), guided munitions and projectiles, space-based systems, electronic warfare systems, and other communication and imaging systems including cellular telephones, and smartphones, although other applications will be apparent. In a more general sense, the disclosed techniques are useful for any systems in which relatively weak, high bandwidth signals are received or processed, and space and power are at a premium.

In accordance with an embodiment, a TIA includes a pre-amplifier stage configured to amplify an input signal. The pre-amplifier stage includes a first P-channel metal oxide semiconductor field effect transistor (MOSFET) (P1), a second P-channel MOSFET (P2), a first N-channel MOSFET (N1), and a second N-channel MOSFET (N2), coupled in series. The gates of P1 and N2 are driven by the input signal. The output of the pre-amplifier stage is provided at a coupling between the drain of P2 and the drain of N1. The pre-amplifier stage also includes an active resistor network configured to provide a variable resistance based on a programmed current bias to provide gain control. The active resistor network is coupled between the gates of P1, N2 and the drains of P2, N1. The variable resistance is used to control the gain of the pre-amplifier stage.

It will be appreciated that the techniques described herein may provide improved performance with lower power consumption and smaller form factor, compared to existing systems that employ differential amplifiers or other conventional amplifier circuits. Numerous embodiments and applications will be apparent in light of this disclosure.

System Architecture

FIG. 1 illustrates an imaging system 100 employing TIAs 130, in accordance with certain embodiments of the present disclosure. The imaging system 100 is shown to include photo diodes 120a, . . . 120n, each photo diode associated with a pixel of an image to be captured. In some embodiments, the photo diodes 120 may be configured in a 2-dimensional array corresponding to the dimensions of the image. The photo diodes are configured to detect electron pulses, for example, associated with photons that impinge on the photo diodes, and generate an electrical signal 125 which may be of relatively small amplitude (e.g., low power/low energy). The signal 125 is provided to the associated TIA 130 for amplification. The TIA 130 is configured to generate an output signal 135 which can be further processed by image processor 140 for any suitable purpose depending on the application. In some embodiments, the image processor 140 may generate a gain control signal 150 to control the level of amplification that each TIA provides. In some embodiments, the gain control signal 150 may be provided from another suitable source.

Figure 2:
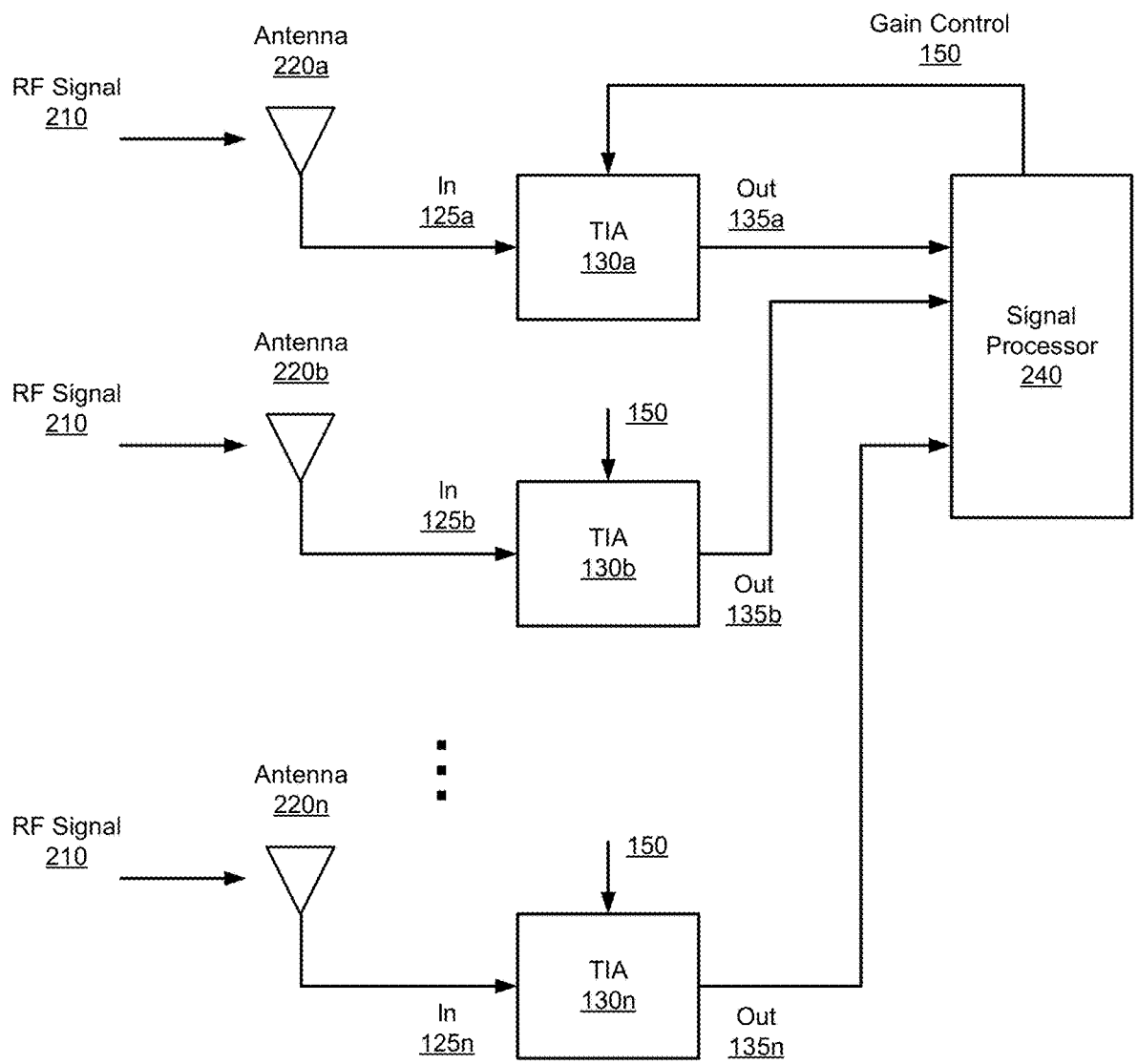
FIG. 2 illustrates a radio frequency (RF) receiver employing TIAs, in accordance with certain embodiments of the present disclosure.

FIG. 2 illustrates an RF receiver 200 employing TIAs 130, in accordance with certain embodiments of the present disclosure. The RF receiver 200 is shown to include an array of antennas 220a, . . . 220n, for example configured as a phased array or any other suitable type of array. The antennas are configured to receive RF signals 210 which may be relatively weak (e.g., low amplitude, low power, or low energy) and provide those signals as an input signal 125 to the associated TIA 130 for amplification. The TIA 130 is configured to generate an output signal 135 which can be further processed by signal processor 240 for any suitable purpose depending on the application. In some embodiments, the signal processor 240 may generate a gain control signal 150 to control the level of amplification that each TIA provides. In some embodiments, the gain control signal 150 may be provided from another suitable source.

Figure 3:
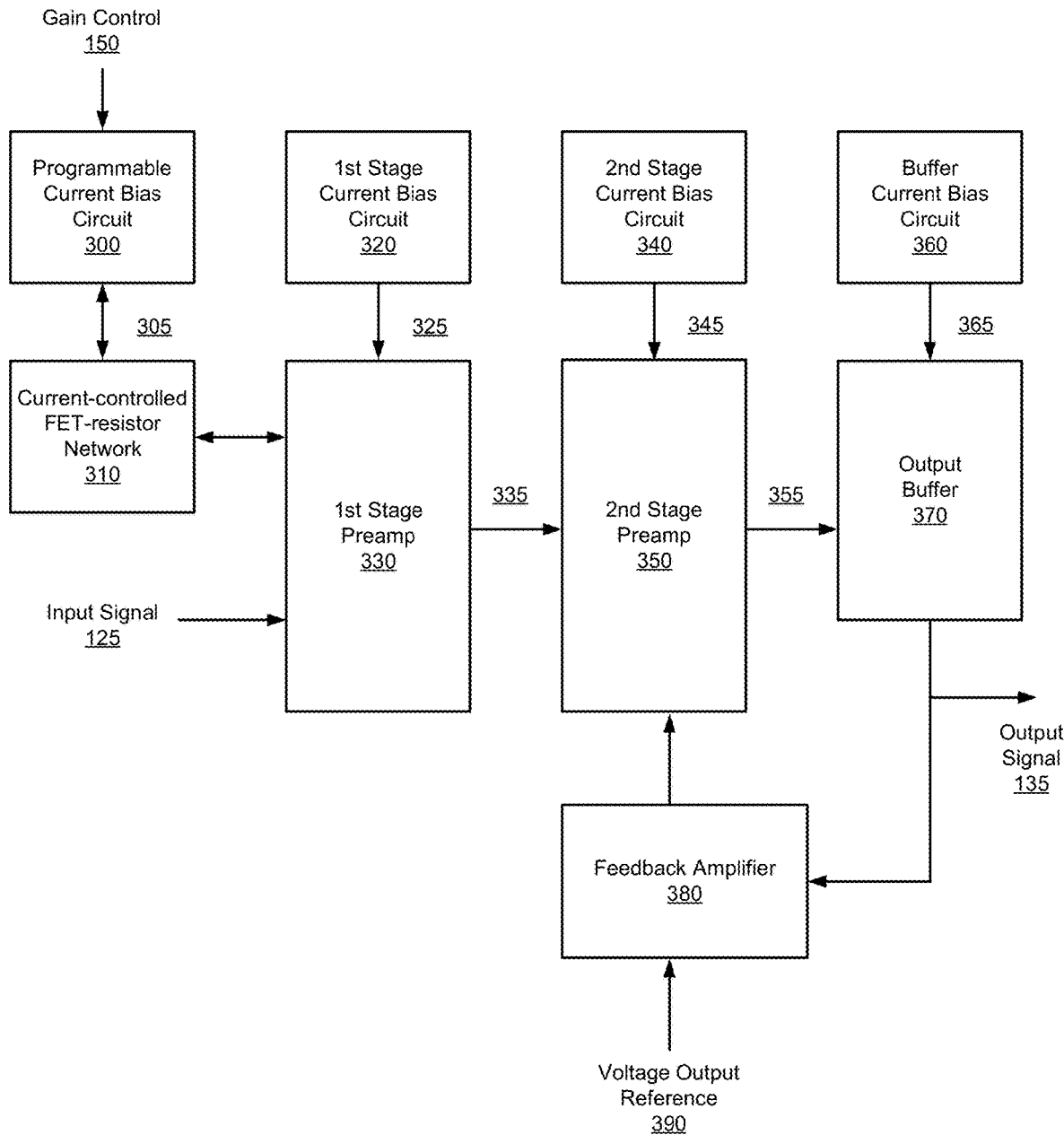
FIG. 3 is a block diagram of the TIAs of FIGS. 1 and 2, configured in accordance with certain embodiments of the present disclosure.

FIG. 3 is a block diagram of the TIAs 130 of FIGS. 1 and 2, configured in accordance with certain embodiments of the present disclosure. The TIA 130 is shown to include a programmable current bias circuit 300, a current-controlled FET-resistor network 310, a first stage current bias circuit 320, a first stage pre-amplifier circuit 330, a second stage current bias circuit 340, a second stage pre-amplifier circuit 350, a buffer current bias circuit 360, an output buffer 370, and a feedback amplifier 380.

The programmable current bias circuit 300 is configured to generate a current bias 305 for the current-controlled FET-resistor network 310 based on a provided digital gain control signal 150. The current-controlled FET-resistor network 310, also referred to as an active resistor network, is configured to provide a variable resistance based on the provided current bias. The variable resistance is used to control the gain of the first stage pre-amplifier circuit 330, as will be explained below in connection with FIGS. 4 and 5.

The first stage current bias circuit 320 is configured to provide a bias current 325 to operate the first stage pre-amplifier circuit 330. In some embodiments, bias current 325 may be in the range of 50 to 70 microamps. The first stage pre-amplifier circuit 330 is configured to provide the initial amplification of the input signal 125 to generate amplified signal 335. The operation of the first stage pre-amplifier circuit 330 will be described in greater detail in connection with FIG. 5 below.

The second stage current bias circuit 340 is configured to provide a bias current 345 to operate the second stage pre-amplifier circuit 350. In some embodiments, bias current 345 may be in the range of 10 to 15 microamps. The second stage pre-amplifier circuit 350 is configured as a differential amplifier to provide additional amplification of the output 335 of the first pre-amplifier stage to generate amplified signal 355. As a second stage, it can operate on lower current than the first stage and also use smaller devices.

The buffer current bias circuit 360 is configured to provide a bias current 365 to operate the output buffer 370. In some embodiments, bias current 365 may be in the range of 3 to 5 microamps. The output buffer 370, also referred to as the final stage amplifier, is configured to provide additional buffering of the output 355 of the second pre-amplifier stage to generate the buffered output signal 135 of the TIA circuit.

The feedback amplifier 380 is configured to provide low frequency feedback (down to DC) to the second preamplifier stage so as to maintain the TIA output 135 average DC level equal to the provided reference voltage 390. The feedback amplifier 380, in conjunction with the second stage preamp 350 and output buffer 370, provides the function of capacitive coupling (essentially a high pass filter) without the parasitic effects associated with large series capacitors. This DC feedback causes the TIA to be relatively insensitive to DC offsets in the first stage preamp 330, second stage preamp 350, and output buffer 370. In particular, this allows the second stage preamplifier components to be relatively small and therefore have low parasitic capacitance without concern for DC offsets that can result from process and mismatch parameter variations that typically occur with device fabrication.

Figure 4:
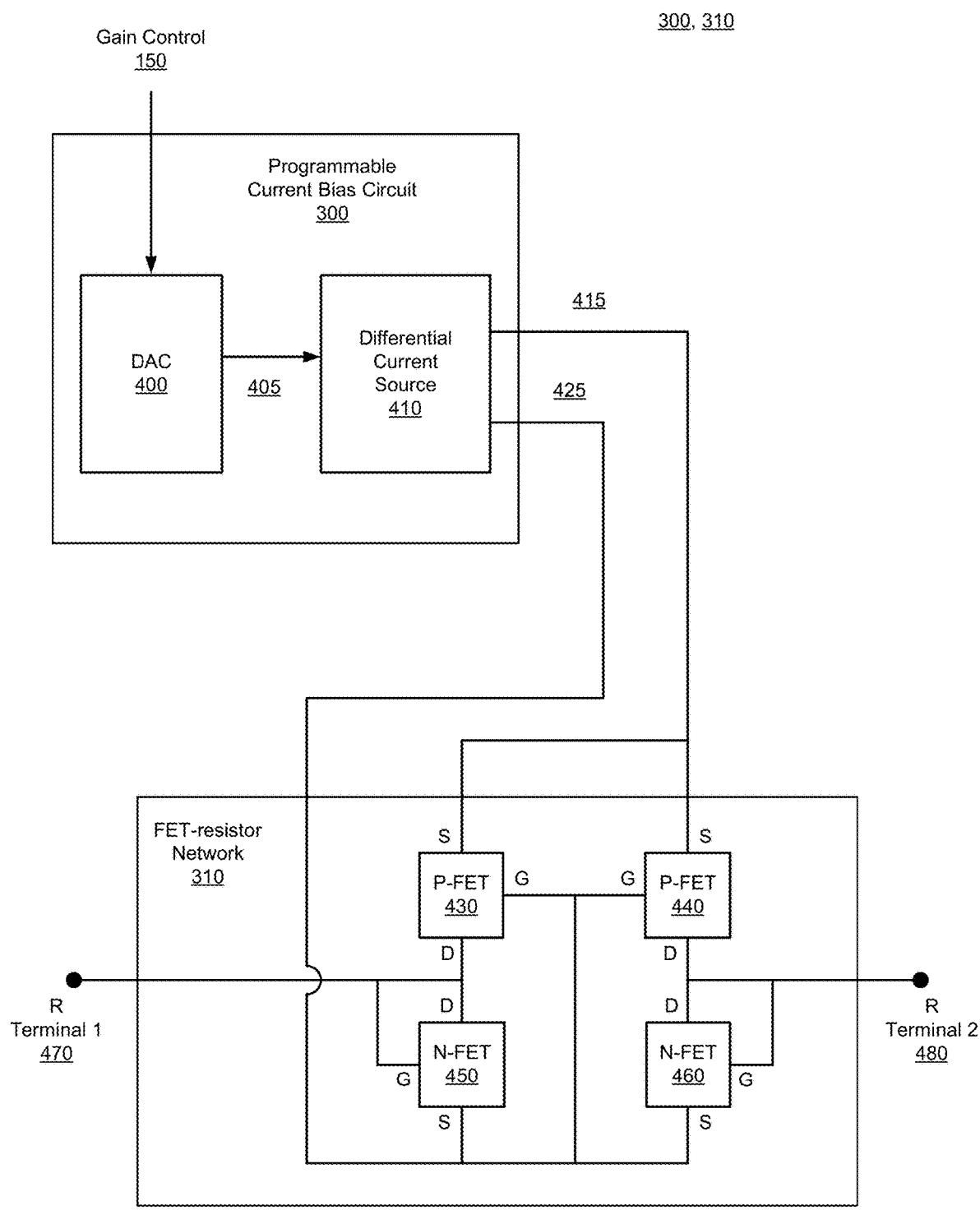
FIG. 4 is a block diagram of the programmable current bias circuit and the active resistor network of the TIA of FIG. 3, configured in accordance with certain embodiments of the present disclosure.

FIG. 4 is a block diagram of the programmable current bias circuit 300 and the active resistor network 310 of the TIA 130 of FIG. 3, configured in accordance with certain embodiments of the present disclosure.

The programmable current bias circuit 300 is shown to include a digital to analog converter (DAC) 400 and a differential current source 410. The DAC 400 is configured to convert a digital gain control sign 150 into an analog signal 405 to feed the current source 410. The current source 410 is configured to generate bias currents 415 and 425 to operate the active resistor network 310.

In some embodiments, the digital gain control signal 150 may be a 3 bit signal to provide a selection of 8 gain levels. In some embodiments, bias current 415 and 425 may be in the range of 10 to 15 nanoamps.

The active resistor network 310 is shown to include a first P-channel MOSFET (P-FET) 430, a second P-FET 440, a first N-channel MOSFET (N-FET) 450, and a second N-FET 460. Bias current 415 drives the source of P-FETs 430 and 440. Bias current 425 drives the source of N-FETs 450 and 460 and the gates of P-FETs 430 and 440. The drains of P-FET 430 and N-FET 450 along with the gate of N-FET 450 are coupled to the first terminal of the active resistor network, R terminal 1 470. The drains of P-FET 440 and N-FET 460 along with the gate of N-FET 460 are coupled to the second terminal of the active resistor network, R terminal 2 480. The active resistor network 310 is configured to provide a variable resistance between the terminal 470 and 480 based on the supplied bias currents 415 and 425. Although the absolute values of the bias currents 415 and 425 are ideally approximately equal, the polarities are reversed such that 415 sources current while 425 sinks current.

Figure 5:
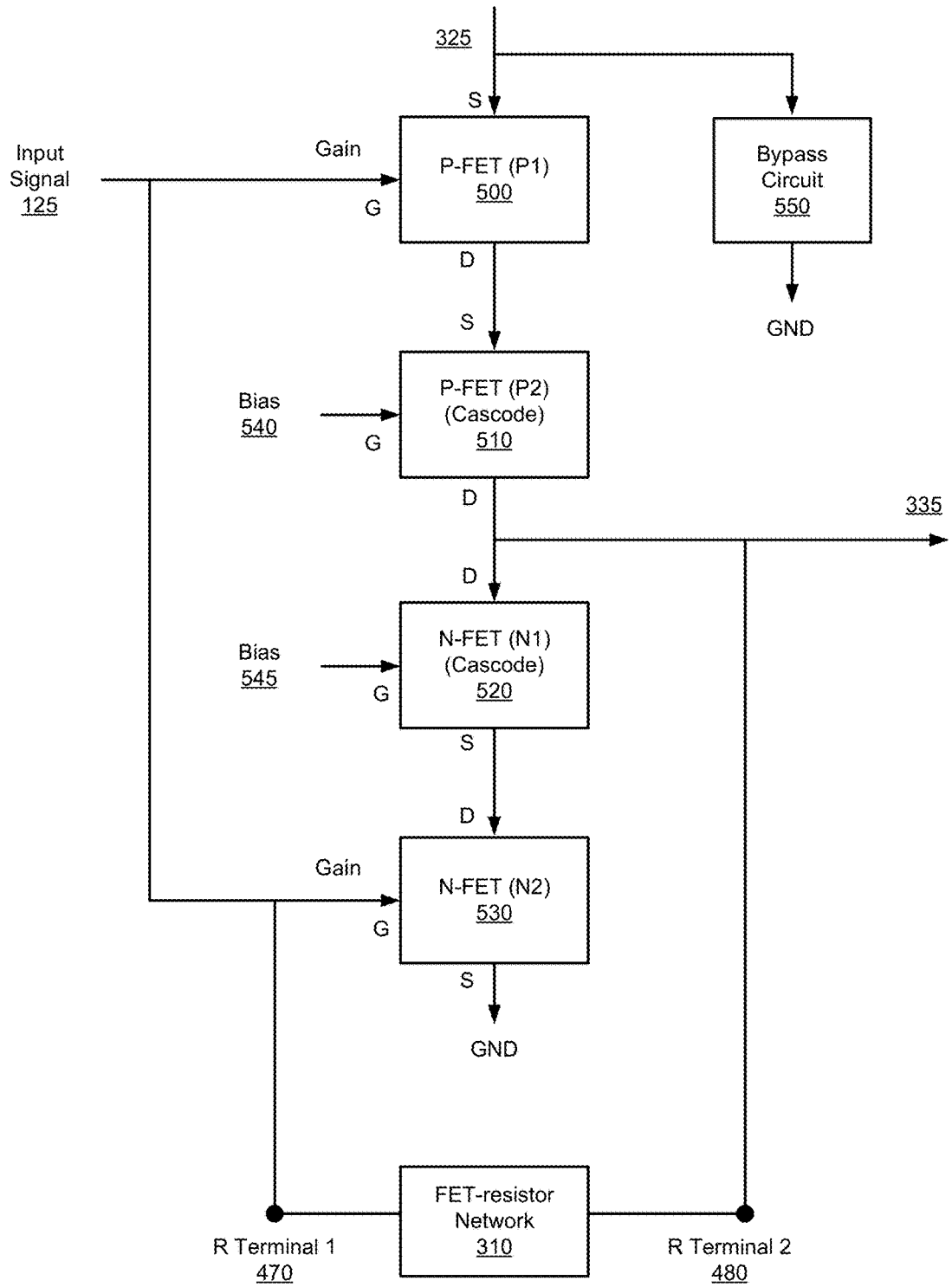
FIG. 5 is a block diagram of the first stage pre-amplifier circuit of the TIA of FIG. 3, configured in accordance with certain embodiments of the present disclosure.

FIG. 5 is a block diagram of the first stage pre-amplifier circuit 330 of the TIA 130 of FIG. 3, configured in accordance with certain embodiments of the present disclosure. The first stage pre-amplifier circuit 330 is shown to include a first P-channel MOSFET (P1) 500, a second P-channel MOSFET (P2) 510, a first N-channel MOSFET (N1) 520, a second N-channel MOSFET (N2) 530, and a bypass circuit 550. MOSFETs P1, P2, N1, and N2 are coupled in series between the current bias source 325 and the circuit ground (GND). The gates of P1 and N2 are driven by the input signal 125. MOSFETs P2 and N1, however, are configured as cascode devices which remain biased to conduct current by application of continuous bias voltages on their gates. Typically, the P2 510 gate bias voltage 540 will go to GND and the N1 520 gate bias 545 will couple to current bias source 325. However, one or both may optionally be externally biased for increased versatility.

MOSFETS P1 and N2 serve as the primary amplifying devices which provide current through the cascode devices P2 and N1. The cascode devices P2 and N1 eliminate the need for the amplifying devices P1 and N2 to generate much voltage gain of their own. The cascode devices P2 and N1 also increase the output impedance of the pre-amplifier stage with minimal capacitance so as to increase the voltage gain at higher frequencies without requiring an associated increase in supply current. Furthermore, cascode devices reduce Miller effect feedback between the drain and the gate of the MOSFET which would otherwise reduce bandwidth and thereby gain at high frequencies.

The output 335 of the first stage pre-amplifier circuit 330 is provided at the coupling between the drain of P2 and the drain of N1.

The use of P-channel and N-channel MOSFETs in this serial configuration allow for the transconductance of MOSFETs P1 and N2 to add together and contribute to the total gain. The operating current of each MOSFET, however, can be limited to the total amplifier current level since the currents do not add in this serial configuration.

The active resistor network 310 is coupled between the first stage pre-amplifier input 125 (e.g., the gates of P1 and N2) and the first stage pre-amplifier output 335 (e.g., the drains of P2 and N1). In other words, R terminal 1 470 is coupled to the input of 330 and R terminal 2 480 is coupled to the output of 330. The variable resistance is used to control the gain of the first stage pre-amplifier circuit 330, which is a majority portion of the overall gain of the TIA 130.

In some embodiments, the first stage pre-amplifier circuit 330 also includes a bypass circuit 550 coupled between the source of P1 and ground. The bypass circuit is configured to increase the bandwidth of the TIA, provide noise isolation between the first pre-amplifier stage and the TIA power supply, and reduce coupling effects between the first pre-amplifier stage and other components of the TIA. In some embodiments, the bypass circuit is implemented as a MOSFET configured to emulate a bypass capacitor, while in other embodiments, the bypass circuit is implemented as a capacitor.

Methodology

Figure 6:
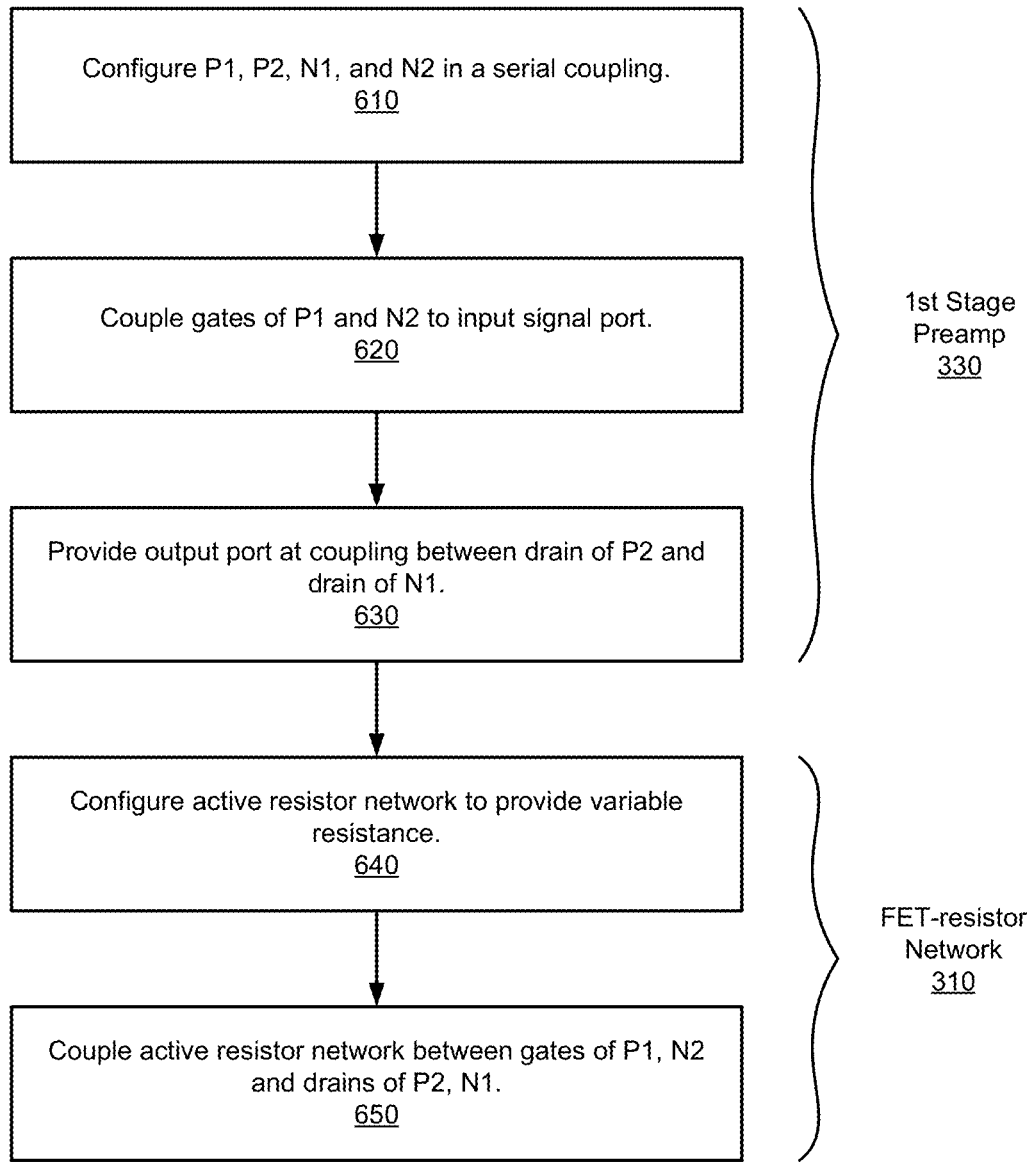
FIG. 6 is a flowchart illustrating a methodology for fabrication of the TIA of FIG. 3, in accordance with an embodiment of the present disclosure.

FIG. 6 is a flowchart illustrating a methodology for fabrication of the TIA of FIG. 3, in accordance with an embodiment of the present disclosure. As can be seen, example method 600 includes a number of phases and sub-processes, the sequence of which may vary from one embodiment to another. However, when considered in aggregate, these phases and sub-processes form a process for TIA fabrication, in accordance with certain of the embodiments disclosed herein, for example as illustrated in FIGS. 3-5, as described above. However other system architectures can be used in other embodiments, as will be apparent in light of this disclosure. To this end, the correlation of the various functions shown in FIG. 6 to the specific components illustrated in the figures, is not intended to imply any structural and/or use limitations. Rather other embodiments may include, for example, varying degrees of integration wherein multiple functionalities are effectively performed by one system. Numerous variations and alternative configurations will be apparent in light of this disclosure.

In one embodiment, method 600 commences, at operation 610, by configuring a pre-amplifier stage 330 to amplify an input signal. The pre-amplifier stage includes a first P-channel MOSFET (P1) 500, a second P-channel MOSFET (P2) 510, a first N-channel MOSFET (N1) 520, and a second N-channel MOSFET (N2) 530. P1, P2, N1, and N2 are coupled in series, as shown in FIG. 5.

At operation 620, the gate of P1 and the gate of N2 are coupled to a port that is configured to receive the input signal to be amplified. In some embodiments, P2 and N1 are configured as cascode devices and the gates of P2 and N1 are biased on.

At operation 630, the output port of the pre-amplifier stage is provided at a coupling between the drain of P2 and the drain of N1.

At operation 640, an active resistor network 310 is configured to provide a variable resistance based on a provided current bias. At operation 650, the active resistor network is coupled between the gates of P1, N2 and the drains of P2, N1. The variable resistance is employed to control the gain of the pre-amplifier stage.

Of course, in some embodiments, additional operations may be performed, as previously described in connection with the system. These additional operations may include, for example, configuring a programmable current bias circuit 300 to generate the current bias for the active resistor network, the current bias based on a provided digital gain control signal.

In some embodiments, the operations further comprise coupling a bypass circuit 550 between the source of P1 and the circuit ground. The bypass circuit is configured to provide increased bandwidth and improved noise isolation between the pre-amplifier stage and the power supply of the TIA circuit.

In some embodiments, the operations further comprise providing a second pre-amplifier stage 350 configured as a differential amplifier to provide additional amplification of the output of the first pre-amplifier stage 330. In some embodiments, an output buffer 370 may be configured to provide additional amplification of the output of the second pre-amplifier stage to generate the output of the TIA circuit. Additionally, a feedback circuit 380 may be configured to provide low frequency feedback of the output of the TIA circuit to the second pre-amplifier stage so that an average level of the output of the TIA circuit is set to a provided voltage reference value.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical entities within the registers, memory units, or other such information storage transmission or displays of the computer system. The embodiments are not limited in this context.

The terms "circuit" or "circuitry," as used in any embodiment herein, are functional structures that include hardware, or a combination of hardware and software, and may comprise, for example, singly or in any combination, hardwired circuitry, programmable circuitry such as computer processors comprising one or more individual instruction processing cores, state machine circuitry, and/or gate level logic. The circuitry may include a processor and/or controller programmed or otherwise configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., non-volatile) in memory devices. The circuitry may, collectively or individually, be embodied as circuitry that forms part of a larger system, for example, an integrated circuit (IC), an application-specific integrated circuit (ASIC), a system-on-a-chip (SoC), communications system, radar system, desktop computers, laptop computers, tablet computers, servers, smartphones, etc. Other embodiments may be implemented as software executed by a programmable device. In any such hardware cases that include executable software, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood, however, that other embodiments may be practiced without these specific details, or otherwise with a different set of details. It will be further appreciated that the specific structural and functional details disclosed herein are representative of example embodiments and are not necessarily intended to limit the scope of the present disclosure. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

One example embodiment of the present disclosure provides a transimpedance amplifier (TIA) circuit comprising: a pre-amplifier stage configured to amplify an input signal, the pre-amplifier stage comprising a first P-channel metal oxide semiconductor field effect transistor (MOSFET) (P1), a second P-channel MOSFET (P2), a first N-channel MOSFET (N1), and a second N-channel MOSFET (N2), coupled in series, wherein a gate of P1 and a gate of N2 are driven by the input signal, and an output of the pre-amplifier stage is provided at a coupling between a drain of P2 and a drain of N1; and an active resistor network configured to provide a variable resistance based on a provided current bias, the active resistor network coupled between the gates of P1 and N2, and the drains of P2 and N1, the variable resistance to control a gain of the pre-amplifier stage.

In some cases, the TIA circuit of claim 1 further comprises a programmable current bias circuit configured to generate the current bias for the active resistor network based on a provided digital gain control signal. In some cases, P2 and N1 are configured as cascode devices to increase output impedance of the pre-amplifier stage to increase gain of the pre-amplifier stage at higher frequencies. In some cases, the pre-amplifier stage further comprises a bypass circuit coupled between a source of P1 and a circuit ground, the bypass circuit configured to increase bandwidth of the TIA and provide noise isolation between the pre-amplifier stage and a power supply of the TIA circuit. In some cases, the pre-amplifier stage is a first pre-amplifier stage and the TIA circuit further comprises a second pre-amplifier stage configured as a differential amplifier to provide additional amplification of the output of the first pre-amplifier stage. In some such cases, the TIA circuit further comprises an output buffer configured to provide additional amplification of an output of the second pre-amplifier stage to generate an output of the TIA circuit. In some such cases, the TIA circuit further comprises a feedback circuit configured to provide lower frequency feedback of the output of the TIA circuit to the second pre-amplifier stage such that an average level of the output of the TIA circuit is set to a provided voltage reference value. In some cases, the active resistor network comprises a third P-channel MOSFET (P3), a fourth P-channel MOSFET (P4), a third N-channel MOSFET (N3), a fourth N-channel MOSFET (N4), and resistive terminals R1 and R2; wherein the provided current bias drives source of P3, P4, N3, N4, and gates of P3 and P4; R1 is coupled to drains of P3 and N3 and the gate of N3; and R2 is coupled to drains of P4 and N4 and the gate of N4.

Another example embodiment of the present disclosure provides an imaging system comprising: an array of photo diodes configured to detect electron pulses; and a transimpedance amplifier (TIA) circuit coupled to each of the photo diodes, the TIA circuit comprising: a pre-amplifier stage configured to amplify an input signal provided by the photo diode, the pre-amplifier stage comprising a first P-channel metal oxide semiconductor field effect transistor (MOSFET) (P1), a second P-channel MOSFET (P2), a first N-channel MOSFET (N1), and a second N-channel MOSFET (N2), coupled in series, wherein a gate of P1 and a gate of N2 are driven by the input signal, and an output of the pre-amplifier stage is provided at a coupling between a drain of P2 and a drain of N1; and an active resistor network configured to provide a variable resistance based on a provided current bias, the active resistor network coupled between the gates of P1 and N2, and the drains of P2 and N1, the variable resistance to control a gain of the pre-amplifier stage.

In some cases, the TIA circuit further comprises a programmable current bias circuit configured to generate the current bias for the active resistor network based on a provided digital gain control signal. In some cases, P2 and N1 are configured as cascode devices to increase output impedance of the pre-amplifier stage to increase gain of the pre-amplifier stage at higher frequencies. In some cases, the pre-amplifier stage further comprises a bypass circuit coupled between a source of P1 and a circuit ground, the bypass circuit configured to increase bandwidth of the TIA and provide noise isolation between the pre-amplifier stage and a power supply of the TIA circuit. In some cases, the pre-amplifier stage is a first pre-amplifier stage and the TIA circuit further comprises a second pre-amplifier stage configured as a differential amplifier to provide additional amplification of the output of the first pre-amplifier stage. In some such cases, the TIA circuit further comprises an output buffer configured to provide additional amplification of an output of the second pre-amplifier stage to generate an output of the TIA circuit, and a feedback circuit configured to provide lower frequency feedback of the output of the TIA circuit to the second pre-amplifier stage such that an average level of the output of the TIA circuit is set to a provided voltage reference value.

Another example embodiment of the present disclosure provides a method for fabricating a transimpedance amplifier (TIA), the method comprising: configuring a pre-amplifier stage to amplify an input signal, the pre-amplifier stage comprising a first P-channel metal oxide semiconductor field effect transistor (MOSFET) (P1), a second P-channel MOSFET (P2), a first N-channel MOSFET (N1), and a second N-channel MOSFET (N2), coupled in series; coupling a gate of P1 and a gate of N2 to a port configured to receive the input signal; providing an output port of the pre-amplifier stage at a coupling between a drain of P2 and a drain of N1; configuring an active resistor network to provide a variable resistance based on a provided current bias; and coupling the active resistor network between the gates of P1 and N2, and the drains of P2 and N1, the variable resistance to control a gain of the pre-amplifier stage.

In some cases, the method further comprises configuring a programmable current bias circuit to generate the current bias for the active resistor network based on a provided digital gain control signal. In some cases, P2 and N1 are configured as cascode devices to increase output impedance of the pre-amplifier stage to increase gain of the pre-amplifier stage at higher frequencies. In some cases, the method further comprises coupling a bypass circuit between a source of P1 and a circuit ground, the bypass circuit configured to increase bandwidth of the TIA and provide noise isolation between the pre-amplifier stage and a power supply of the TIA circuit. In some cases, the pre-amplifier stage is a first pre-amplifier stage and the method further comprises providing a second pre-amplifier stage configured as a differential amplifier to provide additional amplification of the output of the first pre-amplifier stage. In some such cases, the method further comprises configuring an output buffer to provide additional amplification of an output of the second pre-amplifier stage to generate an output of the TIA circuit; and configuring a feedback circuit to provide lower frequency feedback of the output of the TIA circuit to the second pre-amplifier stage such that an average level of the output of the TIA circuit is set to a provided voltage reference value.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be appreciated in light of this disclosure. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:

1. A transimpedance amplifier (TIA) circuit comprising:
a pre-amplifier stage configured to amplify an input signal, the pre-amplifier stage comprising a first P-channel metal oxide semiconductor field effect transistor (MOSFET) (P1), a second P-channel MOSFET (P2), a first N-channel MOSFET (N1), and a second N-channel MOSFET (N2), coupled in series, wherein a gate of P1 and a gate of N2 are driven by the input signal, and an output of the pre-amplifier stage is provided at a coupling between a drain of P2 and a drain of N1;
an active resistor network configured to provide a variable resistance based on a provided current bias, the active resistor network coupled between the gates of P1 and N2, and the drains of P2 and N1, the variable resistance is used to control a gain of the pre-amplifier stage; and
a programmable current bias circuit configured to generate the current bias for the active resistor network based on a provided digital gain control signal.

2. The TIA circuit of claim 1, wherein P2 and N1 are configured as cascode devices to increase output impedance of the pre-amplifier stage to increase gain of the pre-amplifier stage at higher frequencies.

3. The TIA circuit of claim 1, wherein the pre-amplifier stage further comprises a bypass circuit coupled between a source of P1 and a circuit ground, the bypass circuit configured to increase bandwidth of the TIA and provide noise isolation between the pre-amplifier stage and a power supply of the TIA circuit.

4. The TIA circuit of claim 1, wherein the pre-amplifier stage is a first pre-amplifier stage and the TIA circuit further comprises a second pre-amplifier stage configured as a differential amplifier to provide additional amplification of the output of the first pre-amplifier stage.

5. The TIA circuit of claim 4, further comprising an output buffer configured to provide additional amplification of an output of the second pre-amplifier stage to generate an output of the TIA circuit.

6. The TIA circuit of claim 5, further comprising a feedback circuit configured to provide lower frequency feedback of the output of the TIA circuit to the second pre-amplifier stage such that an average level of the output of the TIA circuit is set to a provided voltage reference value.

7. An imaging system comprising:
an array of photo diodes configured to detect electron pulses; and
a transimpedance amplifier (TIA) circuit coupled to each of the photo diodes, the TIA circuit comprising:
a pre-amplifier stage configured to amplify an input signal provided by the photo diode, the pre-amplifier stage comprising a first P-channel metal oxide semiconductor field effect transistor (MOSFET) (P1), a second P-channel MOSFET (P2), a first N-channel MOSFET (N1), and a second N-channel MOSFET (N2), coupled in series, wherein a gate of P1 and a gate of N2 are driven by the input signal, and an output of the pre-amplifier stage is provided at a coupling between a drain of P2 and a drain of N1; and
an active resistor network configured to provide a variable resistance based on a provided current bias, the active resistor network coupled between the gates of P1 and N2, and the drains of P2 and N1, the variable resistance is used to control a gain of the pre-amplifier stage;

wherein the TIA circuit further comprises a programmable current bias circuit configured to generate the current bias for the active resistor network based on a provided digital gain control signal.

8. The imaging system of claim 7, wherein P2 and N1 are configured as cascode devices to increase output impedance of the pre-amplifier stage to increase gain of the pre-amplifier stage at higher frequencies.

9. The imaging system of claim 7, wherein the pre-amplifier stage further comprises a bypass circuit coupled between a source of P1 and a circuit ground, the bypass circuit configured to increase bandwidth of the TIA and provide noise isolation between the pre-amplifier stage and a power supply of the TIA circuit.

10. The imaging system of claim 7, wherein the pre-amplifier stage is a first pre-amplifier stage and the TIA circuit further comprises a second pre-amplifier stage configured as a differential amplifier to provide additional amplification of the output of the first pre-amplifier stage.

11. The imaging system of claim 10, wherein the TIA circuit further comprises an output buffer configured to provide additional amplification of an output of the second pre-amplifier stage to generate an output of the TIA circuit, and a feedback circuit configured to provide lower frequency feedback of the output of the TIA circuit to the second pre-amplifier stage such that an average level of the output of the TIA circuit is set to a provided voltage reference value.

12. A method for fabricating a transimpedance amplifier (TIA), the method comprising:
  configuring a pre-amplifier stage to amplify an input signal, the pre-amplifier stage comprising a first P-channel metal oxide semiconductor field effect transistor (MOSFET) (P1), a second P-channel MOSFET (P2), a first N-channel MOSFET (N1), and a second N-channel MOSFET (N2), coupled in series;
  coupling a gate of P1 and a gate of N2 to a port configured to receive the input signal;
  providing an output port of the pre-amplifier stage at a coupling between a drain of P2 and a drain of N1;
  configuring an active resistor network to provide a variable resistance based on a provided current bias;
  coupling the active resistor network between the gates of P1 and N2, and the drains of P2 and N1, the variable resistance is used to control a gain of the pre-amplifier stage; and
  configuring a programmable current bias circuit to generate the current bias for the active resistor network based on a provided digital gain control signal.

13. The method of claim 12, wherein P2 and N1 are configured as cascode devices to increase output impedance of the pre-amplifier stage to increase gain of the pre-amplifier stage at higher frequencies.

14. The method of claim 12, further comprising coupling a bypass circuit between a source of P1 and a circuit ground, the bypass circuit configured to increase bandwidth of the TIA and provide noise isolation between the pre-amplifier stage and a power supply of the TIA circuit.

15. The method of claim 12, wherein the pre-amplifier stage is a first pre-amplifier stage and the method further comprises providing a second pre-amplifier stage configured as a differential amplifier to provide additional amplification of the output of the first pre-amplifier stage.

16. The method of claim 15, further comprising configuring an output buffer to provide additional amplification of an output of the second pre-amplifier stage to generate an output of the TIA circuit; and configuring a feedback circuit to provide lower frequency feedback of the output of the TIA circuit to the second pre-amplifier stage such that an average level of the output of the TIA circuit is set to a provided voltage reference value.

* * * * *